United States Patent [19]
Sartwell et al.

[11] Patent Number: 5,703,495
[45] Date of Patent: Dec. 30, 1997

[54] DATA OUTPUT IMPEDANCE CONTROL

[75] Inventors: Alfred Leonard Sartwell, Jericho; Endre Philip Thoma, Colchester, both of Vt.

[73] Assignee: International Business Machines Corporation, Armonk, N.Y.

[21] Appl. No.: 421,586

[22] Filed: Apr. 12, 1995

Related U.S. Application Data

[62] Division of Ser. No. 895,971, Jun. 9, 1992, Pat. No. 5,455,517.

[51] Int. Cl.$^6$ ............................................. G01R 31/28
[52] U.S. Cl. ................................... 324/763; 371/22.5
[58] Field of Search ........................... 324/763, 158.1; 371/21.1, 22.5, 22.6; 365/201

[56] References Cited

U.S. PATENT DOCUMENTS

| | | | |
|---|---|---|---|
| 4,811,299 | 3/1989 | Miyazawa et al. | 365/201 |
| 5,072,138 | 12/1991 | Slemmer et al. | 371/21.1 |
| 5,111,433 | 5/1992 | Miyamoto | 365/201 |
| 5,144,627 | 9/1992 | Horie et al. | 371/21.1 |
| 5,155,704 | 10/1992 | Walther et al. | 365/201 |
| 5,157,630 | 10/1992 | Suwa et al. | 365/201 |
| 5,177,745 | 1/1993 | Rozman | 371/21.1 |
| 5,265,100 | 11/1993 | McClure et al. | 365/201 |

*Primary Examiner*—Ernest F. Karlsen
*Attorney, Agent, or Firm*—Heslin & Rothenberg, P.C.

[57] ABSTRACT

The present invention provides an apparatus and method for monitoring the functioning of a special operational mode on an integrated circuit module without the need for a special or dedicated pin. By monitoring the data output pins of the module operation in a special operational mode and premature interruption thereof, is detected. Delayed transition from a state of low impedance to a state of high impedance during the data output cycle is indicative of the special operational mode. The modules which usually have tri-state devices on their output lines are provided with delay circuitry to delay the transition of the tri-state device, during the data output cycle, from a state of low impedance to a state of high impedance while the device remains in a special operating mode.

2 Claims, 4 Drawing Sheets

DATA OUTPUT IMPEDANCE CONTROL

This application is a division of application Ser. No. 07/895,971, filed Jun. 9, 1992, now U.S. Pat. No. 5,455,517.

TECHNICAL FIELD

This invention relates generally to the field of integrated circuits and, more particularly, to a method and apparatus for assuring the maintenance of an operational mode on an integrated circuit module, e.g., burn-in or other test modes on a memory module.

BACKGROUND ART

Integrated circuit semiconductor devices or modules since their first fabrication and use in the 1960's have truly revolutionized our world. Commonly referred to as integrated circuit chips or computer chips, their development and sophistication has accelerated steadily over the years. The first chips had only a few circuit elements; nowadays, chips or modules commonly have tens of thousands of circuit elements on them and can perform a wide variety of sophisticated functions.

One aspect of this increasing sophistication involves the addition of circuitry which allows the module to enter various special operational modes on receipt of the appropriate sequence of signals. Test modes implemented by circuitry built into the module constitute one broad category of operational modes. The signals used to put the module into a special operational mode generally consist of the standard signals the module normally uses during most functions, with the normal sequence of signals altered. This avoids the need for special dedicated pins or connections. However, glitches, such as power interruptions, or failure to maintain the proper sequence of signals can cause the module to exit the special operational mode with no indication that it no longer remains in the desired operational mode.

In some instances, the electronics industry has standards, promulgated by various professional organizations, to follow in fabricating modules with standard operational modes. The Solid State Products Engineering Counsel, JEDEC, on or about Apr. 22, 1987 approved LTRB JC-42.3-86-95A "Optional Special Modes For Address Multiplexed DRAM." This JEDEC publication is incorporated herein by reference. The standards set forth in the JEDEC publication define a scheme for: a.) controlling various special modes for address multiplexed DRAMS; b.) the logic required to enter, control and exit from the special modes; and c.) the basic special test modes plus other special test modes and operational modes. One problem not resolved by the standards is, how to monitor the module to determine that the module is in a special operating mode and to assure that the module remains in the special operating mode for a desired period of time and does not prematurely exit from the special operating mode.

An example will serve to illustrate the problem. One type of test mode circuitry built into a multiplexed DRAM, when activated, increases the voltage in the memory cells above the normal voltage levels the cells experience during normal operation. Burn-in tests conducted shortly after manufacture of the memory module would use this feature. A burn-in test consists of: a.) elevating the voltage in the memory cells of the DRAM to a potential of at least 1 or 2 volts above the normal voltage the DRAM would experience during normal operation; b.) placing the DRAM in an ambient temperature higher than it would normally experience and c.) maintaining these conditions for a specified period of time. Special test ovens with appropriate equipment to put the chips or modules into the necessary test mode can conduct mass tests on large numbers of modules at one time.

Burn-in tests stress the oxide or dielectric connections of a DRAM. The oxide or dielectric connections of a DRAM are located at the gate of the transistors, at the connection between the storage capacitor and the transistor, between the transistor and the bit lines, as well as at other locations throughout the DRAM. Burn-in when properly done, helps eliminate DRAMS with defective oxide or dielectric connections. These defective connections can be a major source of failure for DRAMS during normal operation. Consequently, when properly conducted, burn-in tests increase the reliability of the end product.

The JEDEC standards provide for the initiation of a test mode on a DRAM through a reversal of the sequence of the row address signal (RAS), column address signal (CAS) and read/write signal (W), coupled with decoding of a portion of the row address. However, there is no provision for monitoring module operation in a test mode. Further, as known in the art, the DRAM can exit from the test mode prematurely for several reasons including a momentary power glitch or an improper refresh cycle, both of which would not affect the normal operation of the DRAM and are not otherwise noticeable. If such a failure occurs during a burn-in test and the DRAM falls out of its test mode, given the current state of the technology, the test equipment does not sense this, nor does the tester receive any warning thereof. When the test fails, the memory devices tested experience a higher than usual failure rate during normal operations.

One approach to solve this problem would be to add an extra pin or connection to the DRAM solely for the monitoring of special operational modes. However, this uses a valuable connection or pin which could otherwise be used for other purposes. The challenge then is to provide a method and apparatus for monitoring test and other special operational modes and for signalling a loss or change in such an operational mode, without the necessity of adding a special or dedicated pin or connection to the module.

DISCLOSURE OF INVENTION

The present invention provides a method for monitoring the maintenance of a special operational mode on an integrated circuit module to assure its proper functioning, using one or more existing data out pins. This feature avoids the need for special or dedicated connections or pins on the module. The method of the invention has the further advantage of not interfering or inhibiting the normal function of the pin(s) used to monitor the operational mode.

The present invention also provides an efficient, simple and space saving apparatus, easily fabricated and integrated into the existing structure of the module to implement the method of the invention.

In accordance with the principles of the present invention, an integrated circuit module having an input, internal circuitry receiving signals from the input and an output receiving signals from the internal circuitry and disabled a first predetermined time delay after the internal circuitry has completed operating in a first operating mode, is provided with a circuit for indicating that the internal circuitry is operating in a second operating mode. This circuit consists of a first means coupled to the input for detecting that the internal circuitry is being operated in the second operating mode and second means coupled to the first means and to the output for disabling the output a second predetermined time delay after the internal circuitry has completed operating in the second operational mode.

In a further aspect, a third means coupled to the first means is provided for detecting premature interruption of operation in the second operating mode and, in response thereto, reverting to disabling the output after the first predetermined time delay.

In a further aspect of the invention, an output control circuit for monitoring an operational mode of the integrated circuit module is provided. The output control circuit includes a tri-state device with an input connection for the reception of data, an output connection for transmission of data and a disable control responsive to a disable signal for changing the tri-state device from a state of low impedance which allows the transmission of data to a state of high impedance which prevents the transmission of data. Additionally, a disable circuit which produces a disable signal on completion of said operational mode is provided with means for switching the disable signal between a first line and a second line. The first and second lines are connected to the disable control of the tri-state device. The first line allows for an immediate transmission of the disable signal to the tri-state device and the second line has a delay means for delaying the transmission of the disable signal to the tri-state device. A detection means for detecting initiation of the operational mode, and in response thereto, for setting the switching means to connect the disable signal to the second line is also provided. Finally, monitoring means for monitoring the operation of the integrated circuit module and upon detection of a premature interruption of said operational mode for setting the switching means to connect the disable signal to the first line is also provided.

A single such output control device can provide different delays for different operational or test modes. In a multiple output module, each output line can be provided with an output control device of the present invention.

In accordance with yet another aspect of this invention, there is provided a method of determining whether an integrated circuit module having an output control circuit is in a test mode. The output control circuit transitions from a low impedance state to a high impedance state after a first time period during normal operation of the module. The method includes the steps of maintaining a low impedance state of the output control circuit for a second time period greater than said first time period when the module is operated in a test mode, and sampling data output of the module at a time falling between an end of the first time period and an end of the second time period. The method may further comprise the step of reverting to switching from the low impedance state to the high impedance state after said first time period if the test mode is prematurely interrupted.

In a further aspect of this invention, a method for detecting a change in a special operational mode of an integrated circuit module which outputs data on an output line is provided. This method includes the steps of detecting the initiation of a special operational mode of the module; monitoring for a premature interruption of the special operational mode of the module; and modifying the flow of data on the output line in response to a premature interruption of the special operational mode. The modifying step may comprise halting the flow of data by transitioning from a state of low impedance to a state of high impedance on the output line. The method may further comprise the steps of providing a disable signal; delaying said disable signal by a time delay; halting the flow of data on said output line in response to said delayed disable signal and reducing said time delay in response to a monitored premature interruption of said special operational mode.

BRIEF DESCRIPTION OF DRAWINGS

The foregoing and other aspects, features and advantages of the invention will be apparent from the following more particular description of a preferred embodiment of the invention, as illustrated in the accompanying drawings in which.

BEST MODE FOR CARRYING OUT THE INVENTION

The present invention provides a scheme for monitoring a special operational mode of an integrated circuit module. Although the present invention can be fabricated on and used to monitor operational modes on a broad spectrum of integrated circuit modules, the preferred embodiment described herein details use of the invention on a semiconductor memory device, specifically a DRAM, for monitoring test modes. Semiconductor memory devices, their fabrication and methods of testing are well-known in the art. Most integrated circuit memory devices or DRAMS include internal testing circuitry. The testing circuitry built into the memory device or DRAM provides a variety of options including the ability to elevate the voltage levels in the memory cells for such test as burn-in, or the testing of time delays. Such tests and the circuitry to implement them are well known in the art. Initial testing using the test circuitry fabricated on the DRAM usually occurs shortly after manufacture.

Figure 1:
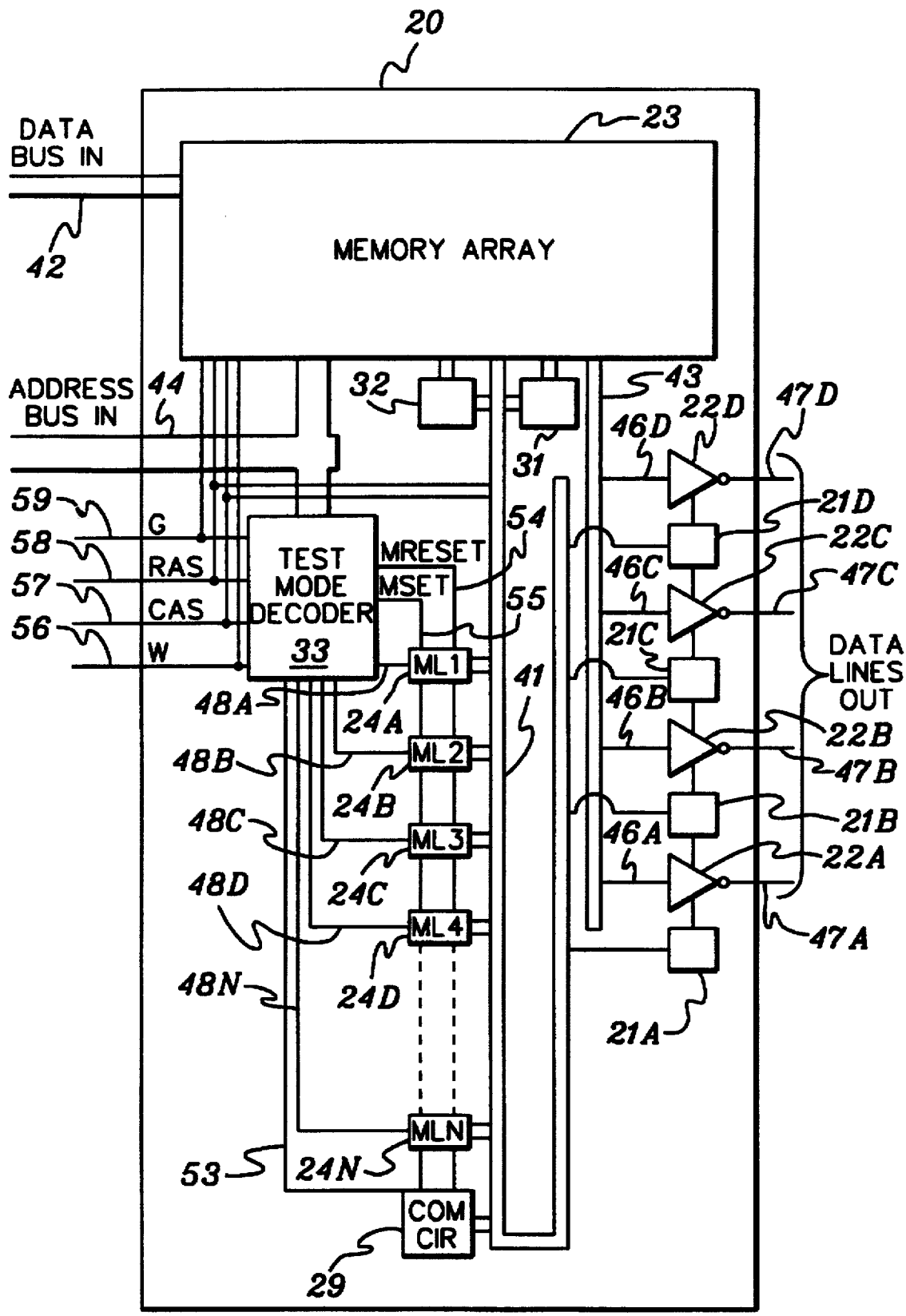
FIG. 1 is a schematic overview of an integrated circuit memory module which includes the apparatus of the present invention.

FIG. 1 depicts schematically an integrated circuit memory module 20 with its salient features and their relation to the data output impedance control of the present invention, four examples of which are shown at 21A, 21B, 21C and 21D. The output impedance control devices 21A–21D, provide a means for individually controlling the output of tri-state devices 22A, 22B, 23C and 23D, respectively. Tri-state devices, their structure, and function are well-known in the art. One version is known as a TRI-STATE GATE™ (registered trademark of National Semiconductor Corporation). When fabricated as part of the output connections of a module, tri-state devices provide a convenient switching means which allows the output of an integrated circuit module to be turned off and on as desired.

The tri-state devices 22A–22D receive data over lines 46A–46D, respectively, from data bus 43. Data bus 43 in turn connects to memory array 23. When the individual tri-state devices 22A–22D are turned on, i.e., put into a state of low impedance, by an appropriate control signal, data transmits to output lines 47A–47D from the associated tri-state device. Correspondingly, when the tri-state devices 22A–22D are shut off, i.e., put into a state of high impedance, by an appropriate signal, data ceases to flow through them onto lines 47A–47D. The output impedance control devices 21A–21D of the present invention, described in detail below, provide a means for delaying the transition from a state of low impedance to a state of high impedance of each tri-state device separately. This delay in transition of each individual tri-state device is monitorable on lines 47A–47D. The activation of the output control devices 21A–21D and their functioning depends on the maintenance of a special operational mode as explained in detail below.

The memory array 23 receives data over a standard input data bus 42. A standard address bus 44 connects to both the memory array 23 and a test mode decoder 33. An output enable G line 59, a row address select (RAS) line 58, a column address select (CAS) line 57 and a read/write (W) line 56 all connect to the memory array 23 as well as to the test mode decoder 33. The normal functions of all these lines are well-known to those skilled in the art. The test mode decoder 33, a familiar device in the art, implements the special operational circuitry pursuant to the JEDEC standards previously cited herein.

Only those features of a memory device germane to the present discussion appear in FIG. 1. Various devices and circuitry schematically depicted in FIG. 1 provide a way for putting the module into various operational modes to test various aspects of the module. Voltage generator 32 is used for tests such as burn-in to raise the voltage levels of the memory cells of memory array 23 above the normal maximum level. Circuitry 31 can change the timing of various signals to test maximum and minimum operating margins.

The module 20 enters a test mode when the appropriate signals, to be described below, are received by the test mode decoder 33. The test mode decoder 33 activates when the appropriate sequence of signals promulgated by the JEDEC standards enter it over lines 58, 57 and 56. Upon receipt of the proper sequence of signals, test mode decoder 33 sets mode latches 24A–24N over line 55 with the mode set signal MSET. The test mode decoder 33 also decodes a row address or addresses it receives over the address bus 44 and accordingly activates a specific mode latch or latches, as the case may be, over one or more of control lines 48A–48N. The number of mode latches and associated control lines can vary as symbolized by the nth mode latch 24N. The mode latches are used to activate various operational modes including those referred to in the JEDEC standards previously referred to and incorporated herein.

For example, assume the first mode latch 24A activates upon receiving the MSET signal over line 55 and the appropriate signal over line 48A from test mode decoder 33. In turn, the mode latch 24A activates the voltage generator 32 over bus 41. The voltage generator 32 might set the voltages in the memory cells at a slightly higher than normal operating potential to prepare the memory array 23 for a burn-in test. Simultaneously, mode latch 24A activates by appropriate electrical connections along bus 41 one of the output control circuits, e.g., 21A of the present invention. Circuit 21A then would delay the output of the tri-state device 22A resulting in a change in the output signal characteristics over line 47A which is monitored outside the module 20. Likewise, other mode latch detectors such as 24B, 24C or 24D, could activate other tests such as timing tests with circuitry depicted at 31. The mode latches, when activated, in turn activate corresponding output control circuits.

If for some reason a mode latch 24A receives a reset signal MRESET over line 54 or the mode latch resets due to a momentary power loss or for some other reason, the special operational mode or test may prematurely terminate. Upon this occurrence, the corresponding output control circuit 21A receives over bus 41 the same signal which caused termination of the operational mode. This would result in a change on the output line 47A, monitorable outside the module, and recognizable as a premature transition from a state of low impedance to high impedance at the end of the data output cycle.

Figure 2:
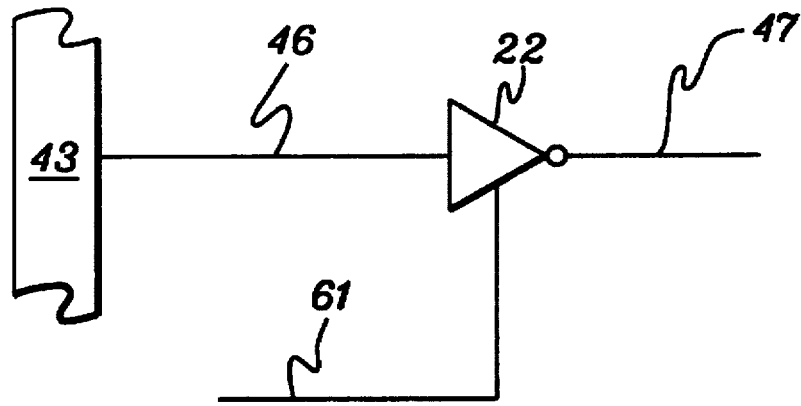
FIG. 2 depicts a prior art output control circuit.

FIG. 2 illustrates a prior art output device of a memory module. As depicted, a tri-state device 22 has an input along line 46 from data line 43 and an output along line 47. Tri-state devices, well-known in the art, output data when in a state of low impedance and when switched to a state of high impedance do not allow the passage of data, thus shutting the line off like a switch. Line 61 provides an output disable signal which controls the transition of the tri-state device 22 between a state of high impedance, when the transmission of data is prevented and a state of low impedance during which data can be transmitted through the tri-state device 22.

Referring back to FIG. 1, as is well-known in the art, the row address select signal RAS on line 58, the column address select signal CAS on line 57, or some combination of the two traveling over bus 41 and out through line 61 act as the output disable signal which effectively cause the tri-state device 22 to transition from a state of high impedance to a state of low impedance or visa versa at the appropriate time.

Figure 3:
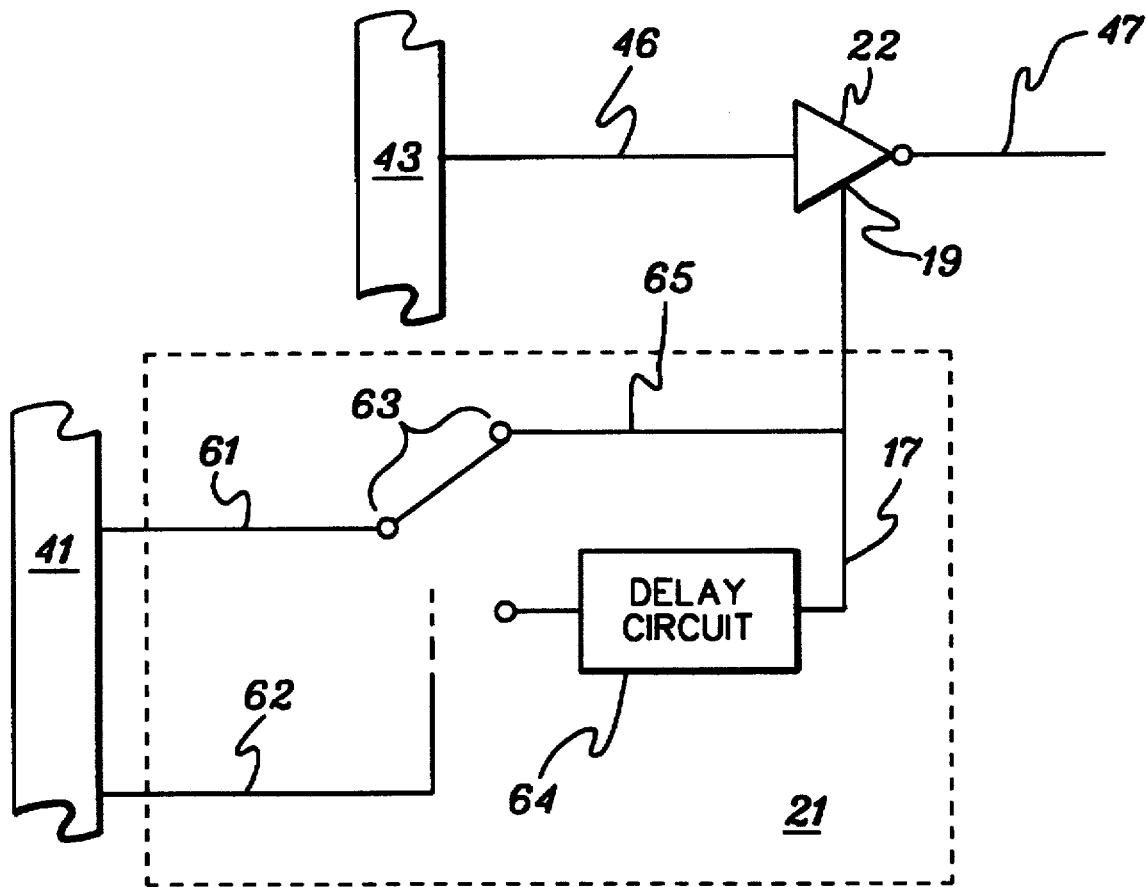
FIG. 3 depicts an output control circuit constructed in accordance with the principles of the present invention.

The output impedance control circuit of the present invention will now be described in detail. FIG. 3 depicts one version of an output impedance control circuit 21 of the present invention. Circuit 21 includes a first line 65 connected to a disable control 19 of tri-state device 22, and a second line 17 also connected to disable control 19. Second line 17 includes a delay circuit 64. A switch 63 is provided for selectively switching a disable signal on line 61 between first line 65 and second line 17. Switch setting is controlled by a control signal provided over line 62. In operation, an output disable signal coming over line 61 from bus 41 encounters switch 63 in its path. When switch 63 is connected to line 65 the tri-state device 22 operates in its normal fashion. In response to an appropriate signal indicating operation in a special operational mode, received over line 62, switch 63 connects the disable signal line 61 to second line 17 containing the delay circuit 64. Connection through delay circuit 64 delays the transmission of the disable signal and, thus, delays the transition of tri-state device 22 from a state of low impedance to a state of high impedance. The delay in transition would accordingly be monitored at output line 47 by appropriate equipment well-known in the art. Delay select line 62, which controls switch 63 connects through bus 41 to the appropriate mode latch 24 and is controlled by a signal received from that mode latch. As long as the mode latch 24 is set and has the appropriate test mode implemented, then switch 63 will connect to the delay circuit 64. If the mode latch 24 resets and the operational mode or test condition terminates, switch 63 will then connect to line 65 and the equipment monitoring line 47 will sense the change as a result of a lack of an expected delay in the transition from low impedance to high impedance during the data output cycle.

Figure 4:
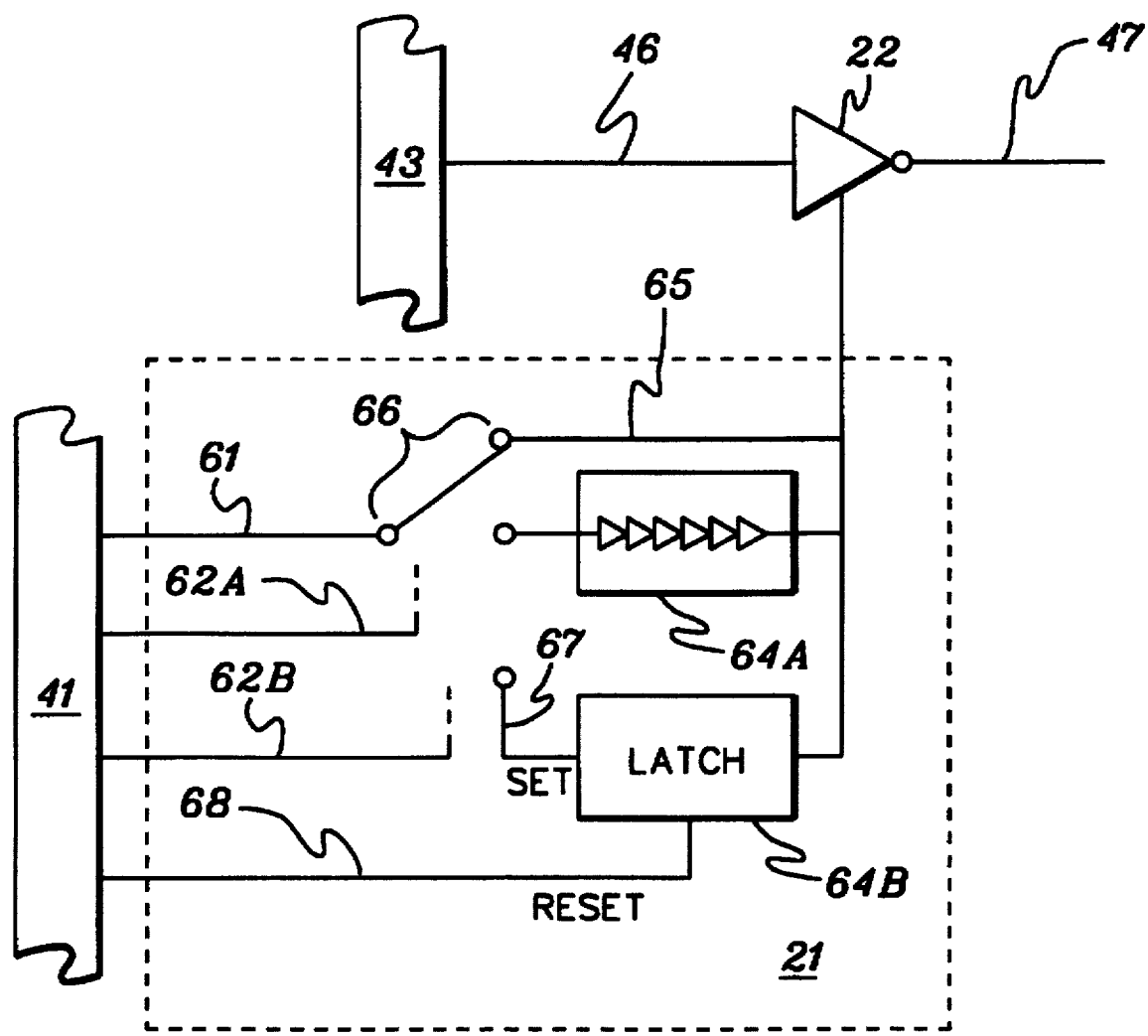
FIG. 4 depicts an alternate version of the output control circuit of the present invention.

Output impedance control circuit 21 may comprise multiple delay lines as shown in FIG. 4. The version depicted in FIG. 4 provides a three-way switch 66 which allows for switching of the output disable line 61 between the normal operation line 65, a first delay circuit 64A or alternatively a second delay circuit 64B. This arrangement would provide alternative delay circuits with different timing characteristics as needed. The setting of switch 66 is controlled by signals received over lines 62A and 62B.

Delay circuits 64A and 64B can provide different time delays, e.g., associated with different operational modes. The internal circuitry of delay circuit 64A could consist of a series connection of monostable devices, e.g., inverters. In such case, the delay circuit would provide a specific time delay. A bi-stable device or latch 64B provides another appropriate delay means for a delay circuit. Once switch 66 puts the delay circuit 64B containing the latch into the circuit by connecting the output disable signal line 61 to a set line 67, of the latch 64B, until a reset input 68 of the latch receives an appropriate RESET signal, the output disable signal will not reach the tri-state device 22. Any number of different signals sent over bus 41 to reset line 68 could provide a signal to reset the latch and thus allow transmission of the output disable signal to the tri-state device 22. The signal which commences the next operating cycle of the memory device provides one potential source of such a reset signal. Of course, output impedance control device 21 may include additional lines containing delay circuits.

The operation of a memory module incorporating output impedance control devices of the present invention will now be described with reference to the timing diagrams of FIGS. 5 and 6.

Figure 5:
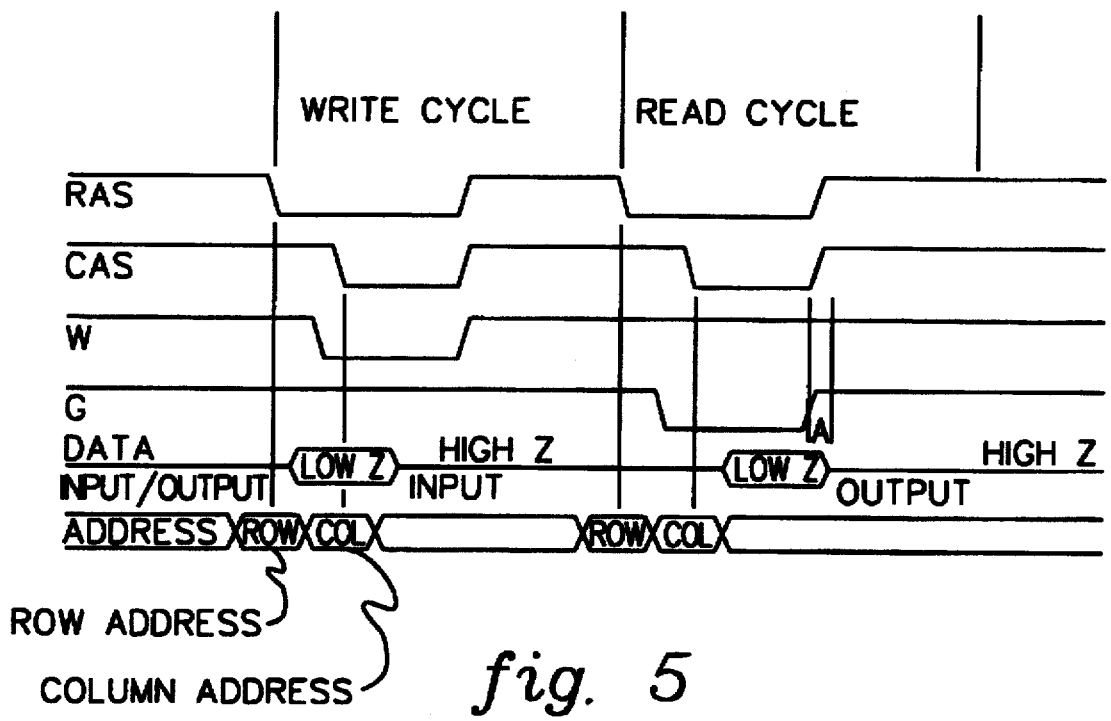
FIG. 5 presents a timing diagram showing a sequence of signals for normal operation of a memory module during both the read and write cycles.

FIG. 5 shows the normal sequence of operating signals encountered during a normal read and write operation of a module. The row address select signal RAS transits to a low state before the column address CAS or the read/write signal W does. Such signaling does not activate the test mode decoder 33 of FIG. 1. Consequently, the data out line remains in a low Z or low impedance state for the normal time period, time A, as depicted on the data out line in FIG. 5.

Figure 6:
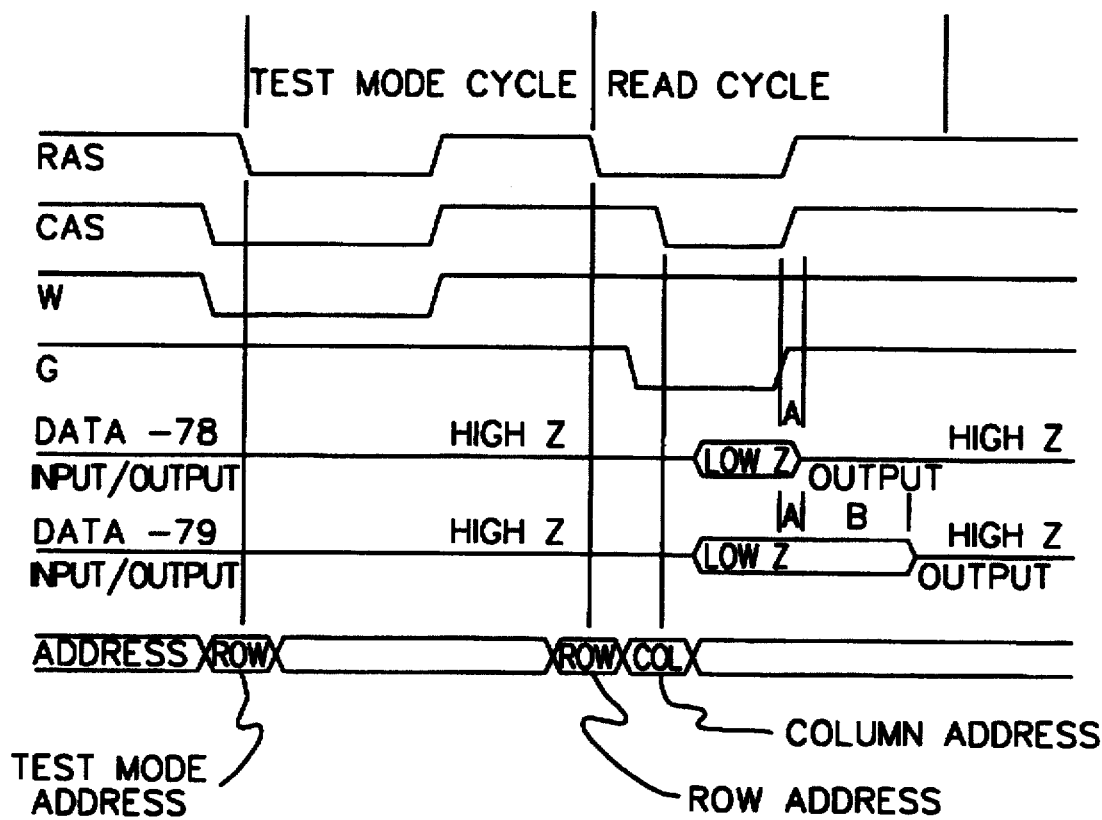
FIG. 6 presents a timing diagram depicting a sequence of signals to set the integrated circuit memory module into a test mode and the difference in the output signal caused by the present invention during the read cycle.

FIG. 6 depicts the sequence of signals used to activate the test mode decoder and ultimately the test circuitry according to the JEDEC standards. Typically, the column address select signal CAS and the read/write signal W go low before the row address select signal RAS goes low. Test mode decoder 33, FIG. 1, then activates and transmits the mode set signal MSET to the mode latches over line 55. Additionally, test mode decoder 33 decodes the row address number received over address bus 44 and activates the appropriate mode latch. As long as the mode latch activated does not reset by receiving the reset signal MRESET over line 54, or the mode latch is not reset for some other reason, the impedance characteristics of the output signal monitored on output line 47 during the read cycle appears as shown by the data out signal 79 in FIG. 6. In effect, a delay in the transition to high impedance, by a time B, is added to the data out signal during the read cycle. Thus, during time B, the data output signal remains in a state of low impedance. Appropriate testing equipment or other equipment monitoring the data out line 47 and strobing for the condition of the output signal during time B would accordingly sense a low impedance state. By contrast, if the mode latch had reset and accordingly the operational mode or test mode prematurely terminated, and the switch setting in circuit 21 reverted to the first line, the equipment strobing at line 47 would detect a high impedance state when strobing during time B, as depicted on data out signal 78, FIG. 6. This then would signal that the operational mode or test mode has been lost.

Several operational mode latches can be activated and function on the module 20, FIG. 1, at one time. The test mode decoder 33 when sending the MSET signal over line 55 would also receive several addresses over address bus 44 which it would decode and then accordingly activate the appropriate mode latches, e.g., 24A–24D over the appropriate control lines 48A–48D. The activated mode latches would in turn activate the appropriate circuitry for the operational modes selected. Additionally, the mode latches activated also activate the appropriate output impedance control circuits, e.g., 21A–21D, over lines 41. Thus, the status of each mode latch and the operational mode it initiates can be monitored on corresponding output lines 47A–47D.

In the system described above, the signals generated by the mode latches 24 to implement the various operational modes also control the output impedance control circuits 21. Thus, the output impedance control circuits react to a change in the signal directly from the mode latches and not from monitoring an internal state of the circuitry implementing the operational mode or an overall condition or state of the module 20. Alternatively, special compare or monitoring circuitry 29, FIG. 1, built into the module 20 during manufacture could provide a direct means for monitoring the actual condition on the module 20. Such circuitry known in the art could directly monitor various conditions on the module 20 including the voltage levels in the memory cells or other operational modes.

Such compare circuitry, as indicated by circuitry 29, would be activated by the test mode decoder 33 in the same manner as the mode latches. The circuitry would then generate an appropriate signal which it would transmit over bus 41 to the appropriate circuit 21, and activate that output impedance control circuit. For example, such activation would connect switch 63 to delay circuit 64 of FIG. 3. The compare circuit 29 would then monitor the actual state of the operational mode or some other condition on the module 20. If it detects a change, it would then send the appropriate switch reversion signal to circuit 21. Thus, the actual condition of the module would directly control the switch 63 and, accordingly, whether or not the expected delay in the transition from low impedance to high impedance on line 47 would appear while strobing for such during the data output cycle.

While the invention has been particularly shown and described with reference to a preferred embodiment thereof, it will be understood by those skilled in the art that various changes in form and details may be made therein without departing from the spirit and scope of the invention.

We claim:

1. A method of determining whether an integrated circuit module having an output control circuit is in a test mode, the output control circuit transitioning from a low impedance state to a high impedance state after a first time period during normal operation of the module, comprising the steps of:

maintaining a low impedance state of the output control circuit for a second time period greater than said first time period when the module is operated in a test mode; and sampling data output of the module at a time falling between an end of the first time period and an end of the second time period to determine whether the output control circuit is in the low impedance state, thereby determining whether the module is in the test mode.

2. The method of claim 1 further comprising the step of reverting to switching from the low impedance state to the high impedance state after said first time period if the test mode is prematurely interrupted.

* * * * *